United States Patent
Hershenson et al.

(10) Patent No.: US 8,910,088 B2
(45) Date of Patent: *Dec. 9, 2014

(54) AUTOMATED CIRCUIT DESIGN USING ACTIVE SET SOLVING PROCESS

(71) Applicant: Synopsys, Inc., Mountain View, CA (US)

(72) Inventors: Maria del Mar Hershenson, Los Altos, CA (US); Sunderarajan S. Mohan, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/669,342

(22) Filed: Nov. 5, 2012

(65) Prior Publication Data

US 2013/0125081 A1    May 16, 2013

Related U.S. Application Data

(63) Continuation of application No. 12/195,326, filed on Aug. 20, 2008, now Pat. No. 8,307,309.

(51) Int. Cl.
*G06F 17/50* (2006.01)

(52) U.S. Cl.
CPC ........ *G06F 17/5045* (2013.01); *G06F 17/5063* (2013.01); *G06F 17/504* (2013.01)
USPC .............................. 716/51; 716/111; 716/136

(58) Field of Classification Search
CPC   G06F 17/5045; G06F 17/5063; G06F 17/504
USPC .................. 716/51, 52, 54, 56, 111, 112, 136
See application file for complete search history.

(56) References Cited

U.S. PATENT DOCUMENTS

| | | | |
|---|---|---|---|
| 6,269,277 B1 | 7/2001 | Hershenson et al. | |
| 6,269,469 B1 | 7/2001 | Paisic et al. | |
| 7,299,459 B1 | 11/2007 | Boyd et al. | |
| 7,574,686 B1 | 8/2009 | Wadland et al. | |
| 8,307,309 B1 * | 11/2012 | del Mar Hershenson et al. | 716/51 |
| 2002/0120912 A1 | 8/2002 | He et al. | |
| 2006/0075365 A1 * | 4/2006 | Hershenson et al. | 716/2 |
| 2007/0028201 A1 | 2/2007 | Mehrotra et al. | |
| 2007/0124707 A1 * | 5/2007 | Sutjahjo et al. | 716/4 |
| 2008/0077890 A1 | 3/2008 | Hershenson et al. | |
| 2008/0250370 A1 * | 10/2008 | Abbaspour et al. | 716/6 |
| 2009/0070726 A1 | 3/2009 | Mehrotra et al. | |
| 2009/0216359 A1 | 8/2009 | McConaghy et al. | |

OTHER PUBLICATIONS

Ben-Tal, Aharon, et al, "Extending Scope of Robust Optimization: Comprehensive Robust Counterparts of Uncertain Problems," Math Program, Ser. B 107, Published online Feb. 2, 2006, Springer-Verlag, pp. 63-89.

(Continued)

*Primary Examiner* — Vuthe Siek
(74) *Attorney, Agent, or Firm* — HIPLegal LLP; Judith A. Szepesi

(57) ABSTRACT

A method is described that involves solving a family of equations for a circuit being designed over a subset of operational scenarios, thereby producing numeric values for design parameters of the circuit. The family of equations is enhanced with the numeric values are solved over a second subset of the operational scenarios. A design for the circuit that includes the numeric values is produced.

20 Claims, 5 Drawing Sheets

(56) References Cited

OTHER PUBLICATIONS

Ben-Tal, Aharon, et al, "Robust Convex Optimization," Mathematics of Operations Research, vol. 23, No. 4, Nov. 1998, pp. 669-805.

Ben-Tal, Aharon, et al, "Robust Optimization—Methodology and Applications," Mathematical Programming Series B, V. 92, Published online Feb. 14, 2002, Springer-Verlag, pp. 452-480.

Mutapcic, Almir, et al, "Robust Design of Slow-Light Tapers in Periodic Waveguides," Received 2008 for publication in Engineering Optimization, vol. 41, No. 4, Apr. 2009, pp. 365-384.

Mutapcic, Almir, et al, "Cutting-Set Methods for Robust Convex Optimization With Pessimizing Oracles," Received Apr. 1, 2008, published—Optimization Methods & Software, vol. 24, No. 3, Jun. 2009, pp. 381-406.

Bienstock, Daniel, "Experiments With Robust Optimization," Duke University, Dec. 6, 2006, <www.columbia.edu/~dano/talks.pdf>, 52 pages.

Bienstock, Daniel, "Experiments in Robust Portfolio Optimization," Columbia University, Jan. 2007, <www.cfe.columbia.edu/pdf-files/Bienstock_01_07.pdf>, 41 pages.

Calafiore, Giuseppe, et al, "Uncertain Convex Programs: Randomized Solutions and Confidence Levels," Mathematical Programming Series A, vol. 102, No. 1, Jan. 2005, pp. 25-46.

Werner, Ralf, "Cascading—An Adjusted Exchange Method for Robust Conic Programming," Dec. 2006, <www.optimization-online.org/DB_FILE/2006/12/1551.pdf>.

Boyd, Stephen, "Convex Optimization," Cambridge University Press, 2004, Chapter 4 on "Convex Optimization Problems", pp. 127-213.

\* cited by examiner $$GAIN = K_1 \left(\frac{nw}{L}\right)^{1/2} (IDS)^{1/2} R_L \qquad \text{eqn. 1}$$

$$UGBW = 2\Pi K_1 C_L \left(\frac{nw}{L}\right)^{1/2} (IDS)^{1/2} R_L^{\ 2} \qquad \text{eqn. 2}$$

$$POWER = V_{DD}(IDS) \qquad \text{eqn. 3}$$

$$I_{DS} = K_2 \left(\frac{nw}{L}\right)(V_{IN} - V_T)^2 \qquad \text{eqn. 4}$$

$$V_{DS} = V_{DD} - I_{DS} R_L \qquad \text{eqn. 5}$$

$$SIZE = K_3(nW \bullet L) + K_4 R_L + K_5 C_L \qquad \text{eqn. 6}$$

| SCENARIO \ VARIABLE | $V_i$ MFL CORNER $V_T$ $K_D, K_2$ | TEMP | $V_{DD}$ | $y_i$ $I_{DS}$ | $V_{DS}$ |
|---|---|---|---|---|---|
| 1 | TT | 25° | 1.8v | | |
| 2 | SS | 125° | 1.62v | | |
| 3 | SS | 125° | 1.98v | | |
| 4 | SS | -35° | 1.62v | | |
| 5 | SS | -35° | 1.98v | | |
| 6 | FF | 125° | 1.98v | | |
| 7 | FF | -35° | 1.98v | | |
| 8 | FF | 125° | 1.62v | | |
| 9 | FF | -35° | 1.62v | | |

$X = w, n, L, R_L$ $U_D = K_1, K_2, K_3, K_4, K_5, V_{IN}, v_{in}, C_L$

MINIMIZE [SIZE]
  SUBJECT   TO:

$K_1 \left( \dfrac{W}{nL} \right)^{1/2} (IDS)^{1/2} R_L \quad > \quad 2.0$ eqn. 1

$2\Pi K_1 C_L \left( \dfrac{W}{nL} \right)^{1/2} (IDS)^{1/2} \quad > \quad 100\ E\ 6$ eqn. 2

$I_{DS}(V_{DS}) \quad > \quad 10\ E\ 3$ eqn. 3

$K_2 \left( \dfrac{nw}{L} \right)(V_{IN} - V_T)^2 \quad = \quad I_{DS}$ eqn. 4

$V_{DD} - I_{DS} R_L \quad = \quad V_{DS}$ eqn. 5

$K_3(W \bullet nL) + K_4 R_L + K_R C_L \quad = \quad SIZE$ eqn. 6

$V_{IN} \quad = \quad 1.0$ eqn. 7

$C_L \quad = \quad 2\ E^{-}12$ eqn. 8

$v_{in} \quad = \quad 0.0$ eqn. 9

$K_1\ thru\ K_5 \quad = \quad K_1\ thru\ K_5\ for\ process\ "X"$ eqn. 10-14

$V_T \quad = \quad SCENARIO\ DEPENDENT$ eqn. 15

$V_{DD} \quad = \quad SCENARIO\ DEPENDENT$ eqn. 16

FIG. 4

AUTOMATED CIRCUIT DESIGN USING ACTIVE SET SOLVING PROCESS

This application is a continuation of U.S. patent application Ser. No. 12/195,326, filed on Aug. 20, 2008, now U.S. Pat. No. 8,307,309 issuing on Nov. 6, 2012.

FIELD OF INVENTION

The present invention relates generally to electronic design automation and more specifically to chip design by active set solving.

BACKGROUND

Previous work, such as that described in U.S. Pat. No. 6,269,277 entitled "System And Method For Designing Integrated Circuits", has demonstrated the ease with which a circuit design can be optimized against a critical parameter (also referred to as an "objective") using geometric programming (GP) techniques. Here, each equation in a family of equations that describe the circuit's characteristics and/or behavior is expressed in monomial or posynomial form (which for purposes of this application includes convex form) as an equality or inequality in a computer readable format (e.g., in a text file). Equations may also be expressed in signomial form (or another analytical form) if the design process is targeted to a signomial problem solver (or another solver including a general-purpose numerical optimization solver).

Numeric values are plugged into the family of equations for a "scenario" of the circuit's operation that specifies its operating conditions (e.g., temperature, supply voltage, input voltage, pertinent manufacturing process parameters, input/output conditions, load conditions, switch settings, etc.) and desired functional characteristics (e.g., gain, bandwidth, etc.). Equation terms within the family of equations that specify transistor level netlist details (e.g., such as transistor gate dimensions, resistance values and capacitance values) are left as "unknowns" that need to be defined in order for the circuit to meet the objective (e.g., "minimized" power consumption or size) under the scenario.

The family of numerically enhanced equations is then provided to a signomial or geometric optimization problem solver or generic numerical optimization solver implemented on a computing system with program code. Execution of the optimization problem solving sequence returns specific numeric values for the transistor level unknowns that satisfy the objective (e.g., minimal power consumption or circuit size) for the desired number of scenarios. Thus, the solution provided by the optimization problem solver provides details sufficient to design a transistor level netlist for the circuit.

A problem however is that commercial applications demand that a circuit design meet certain behavioral characteristics over a large number of scenarios. As such, an optimization problem sequence must be undertaken across multiple scenarios in an effort to confirm the circuit's adaptability to varying conditions. Often times, because of the practical difficulties associated with optimization problem solving over large numbers of scenarios, one limits the number of scenarios over which the problem is solved. As a result, one or more of the original scenarios can be infeasible and a global transistor level definition for the circuit cannot be determined over the entire range of scenarios Thus, a need exists for a circuit design process that utilizes optimization problem solving techniques to produce transistor level details for a circuit that "works" over a large number of different scenarios.

In the field of mathematics, "robust optimization" is an optimization approach that deals with uncertainty. Specifically, in order to deal with the uncertainty, different scenarios are solved that express numeric values across the uncertainty range. Also in the field of mathematics, a process known as an "active set method" partitions inequality constraints into two sets: an active set for immediate solution and an inactive set for subsequent solution. The inactive set of inequality constraints is ignored when the active set of inequality constraints is solved. Known prior art active set methods, however, do not: 1) express equalities in the set of constraints (i.e., only inequalities are used); or, 2) classify variables within the set of constraints as being unknown and scenario dependent.

BRIEF DESCRIPTION OF THE DRAWINGS

The present invention is illustrated by way of example and not limitation in the figures of the accompanying drawings, in which like references indicate similar elements and in which:

FIG. 4 shows an optimization problem for the circuit of FIG. 2A, equations of FIG. 2B and scenarios of FIG. 3;

DETAILED DESCRIPTION

Figure 1:
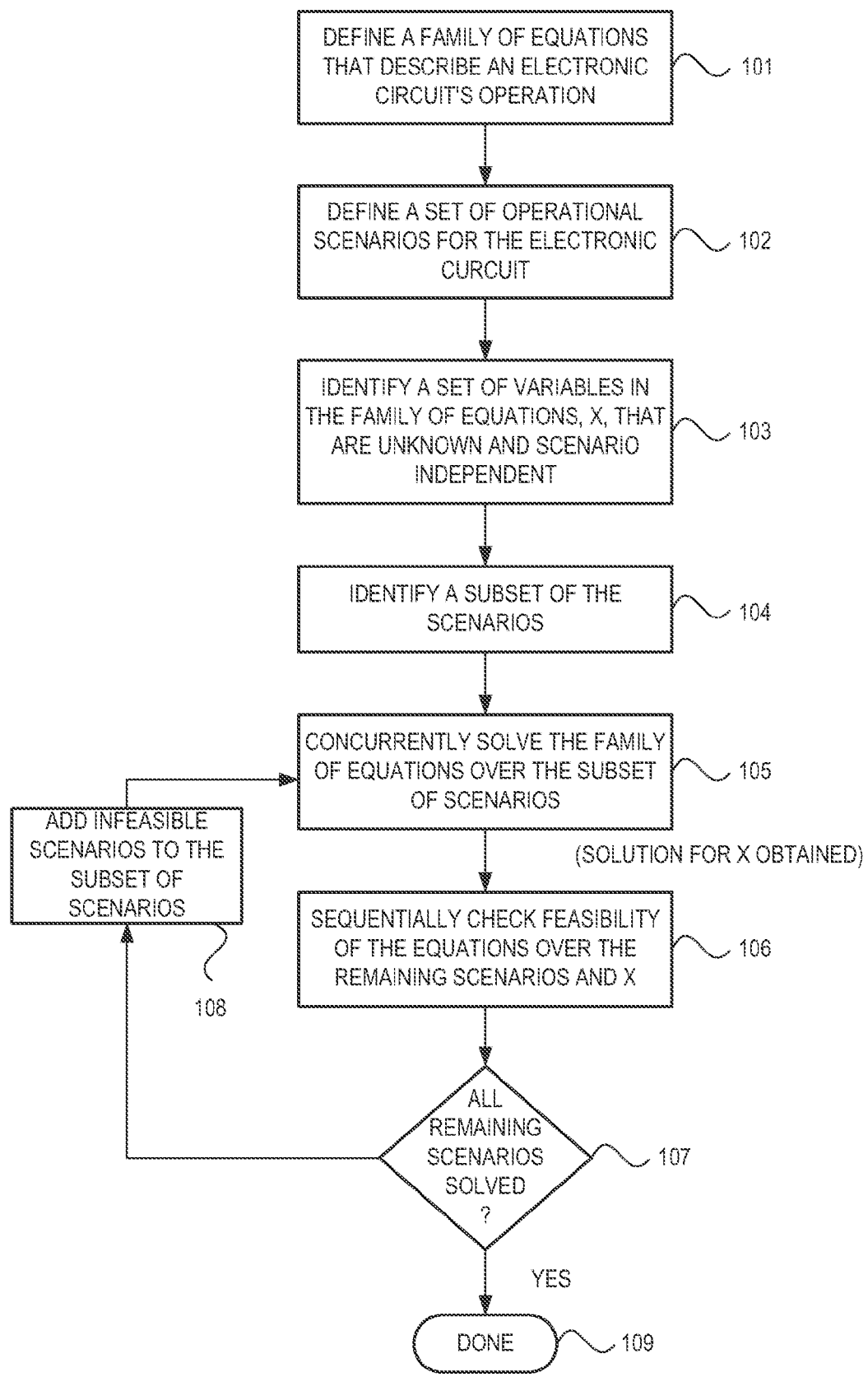
FIG. 1 shows a methodology for designing an electronic circuit.

FIG. 1 shows a circuit design methodology that incorporates "active set" optimization problem solving principles. More specifically, as will become more apparent in the description that follows, the methodology of FIG. 1 is capable of defining transistor dimensions (such as gate length, gate width and number of gate fingers) for a generic circuit design that is targeted to a specific manufacturing process and is expected to sustain certain performance criteria over a number of different operating scenarios. The methodology of FIG. 1 will be explained using, as an example, the common source amplifier circuit of FIG. 2A.

Figures 2A, 2B:
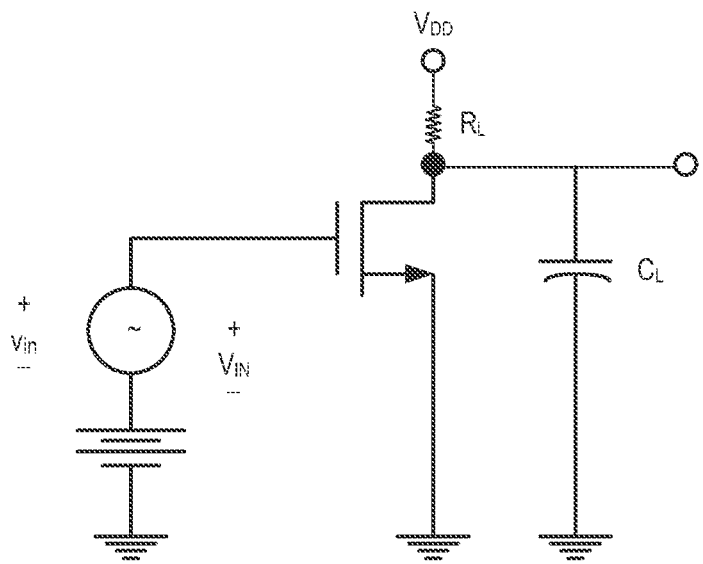
FIG. 2A shows an exemplary circuit.
FIG. 2B shows an exemplary family of equations for the circuit of FIG. 2A.

According to the design methodology of FIG. 1, a family of equations are first articulated for an electronic circuit's operation 101. An exemplary set of equations for the common source amplifier of FIG. 2A are presented in FIG. 2B. A description of these equations is provided immediately below.

Eqn. 1 specifies the gain of the common source amplifier as a function of: 1) $k_1$, where $k_1$ is a constant that is particular to the manufacturing process that the circuit is targeted to; 2) $(nW/L)^{0.5}$ where nW is the effective gate width of the amplifier's transistor (specified as the product of the width (W) of a single gate finger and the number of gate fingers (n)) and 1/L where L is the length (L) of a single gate finger; 3) $(IDS)^{0.5}$ where IDS is the transistor's DC drain-to-source current; and, 3) $R_L$ where $R_L$ is the amplifier's load resistance.

Eqn. 2 specifies the unity gain bandwidth (UGBW) of the amplifier as a function of: 1) $k_1$, $(nW/L)^{0.5}$, $(IDS)^{0.5}$ and $R_L$ as described above; and, 2) $C_L$ where $C_L$ is the amplifier's load capacitance.

Eqn. 3 specifies the power consumption of the amplifier circuit as $V_{DD}*I_{DS}$. Eqn. 4 specifies the steady state (DC) drain-to-source current, IDS, of the amplifier's transistor as a function of: 1) $k_2$ where $k_2$ is a second constant that is particular to the manufacturing process that the circuit is targeted to; 2) (nW/L) where n, W and L are described above for eqn. 1; 3) $V_{IN}$ where $V_{IN}$ is the amplifier's steady state input voltage; and, 4) $V_T$ where $V_T$ is the threshold voltage of the amplifier's transistor.

Eqn. 5 specifies the steady state drain-to-source voltage, $V_{DS}$, of the amplifier's transistor as a function of $V_{DD}$, $I_{DS}$ and $R_L$.

Eqn. 6 specifies the size of the amplifier circuit as a function of: 1) $k_3$, $k_4$ and $k_5$ which are third, fourth and fifth constants that are particular to the manufacturing process that the circuit is targeted to; and, 2) n, W, L, $R_L$ and $C_L$.

Thus, referring to FIGS. 1, 2A, and 2B, the family of equations of FIG. 2B define 101 the operation of the amplifier circuit of FIG. 2A. It is pertinent to point out that additional equations may be added to the family of equations, e.g., to more completely define the circuit's operating characteristics. However, in order to not obfuscate the teachings of the present application and for the sake of simplicity, the present example assumes that FIG. 2B provides a sufficient listing of equations for the amplifier circuit of FIG. 2A. Continuing with the present example, referring to FIG. 1, once a family of equations have been defined 101 for a particular circuit, a set of operational scenarios for the electronic circuit are defined 102.

Figure 3:
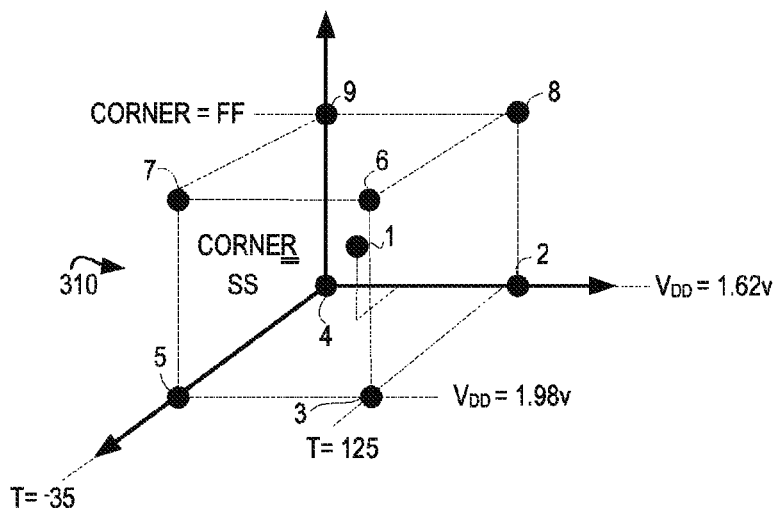
FIG. 3 shows exemplary scenarios for the circuit and equations of FIGS. 2A and 2B.

FIG. 3 shows a depiction of an exemplary set of scenarios for the amplifier circuit of FIG. 2A. As observed in FIG. 3 there are nine scenarios where each scenario has a unique "condition set" of: (1) manufacturing process "corner" defined by specific values of manufacturing parameters which in this case would affect the values of transistor threshold voltage ($V_T$) and the constants k1 and k2 observed in FIG. 2b; (2) temperature (T) which also affects the values of transistor threshold voltage ($V_T$) and the constants k1 and k2 observed in FIG. 2b; and, (3) supply voltage ($V_{DD}$). The manufacturing corner of the targeted manufacturing process can be defined, for example, by three parameters: SS, TT and FF for slow, typical and fast respectively. Inset 310 of FIG. 3 shows where scenarios 1 through 9 are positioned on a three dimensional cube defined by their respective values for each of the manufacturing corner, temperature, and $V_{DD}$ parameters. Thus, designing the circuit over scenarios 1 through 9 corresponds to an attempt to "harden" or "qualify" the amplifier's design against a spectrum of environmental and manufacturing conditions that may be realized if the amplifier is actually manufactured.

Referring back to FIG. 1, a set of variables x within the family of equations is identified as being "unknown" and "scenario-independent" 103. Here, unknown means that an ensuing optimization problem solving sequence will attempt to solve for these variables (that is, the optimization problem solving sequence will attempt to provide a specific number to each such variable). Scenario-independent means that the variables represent features that do not change from scenario-to-scenario. For simplicity, the word "term" or "variable" corresponds to a component of an equation. Thus, terms and variables appear on the right hand side of the equations presented in FIG. 2B.

Typically, a circuit's set of unknown, independent variables x include its transistor level details (such as gate length (L), gate finger width (W) and the number of gate fingers (n)). Thus, typically, L, W and n are variables for which specific numeric values are sought through the optimization problem solving sequence, yet, because these variables pertain to a manufactured structure (i.e., the dimensions of a transistor's gate node) they do not change from scenario to scenario. For purposes of this example, the amplifier's load resistance ($R_L$) is also left as an unknown, scenario-independent variable within the equation family of FIG. 2B (which, again, is dependent on the dimension of a manufactured structure). In general, for other types of circuits, there can be other types of unknown, independent variables, such as settings of switches in a circuit, number of stages in an amplifier/oscillator, etc.

Other terms appearing within the equation family of FIG. 2B can be classified as "unknown and scenario dependent", "known and scenario independent" or "known and scenario dependent".

In the case of terms that are "unknown and scenario dependent", the optimization problem solving sequence provides specific numeric values for these terms, but, the numeric values provided by the problem solving sequence can change from scenario to scenario. Typically, unknown and scenario dependent terms correspond to operating voltages and currents within the circuit. The unknown and scenario dependent terms observed in FIG. 2B are $I_{DS}$ (which appears in eqns. 1 thru 4) and $V_{DS}$ (which appears in eqn. 4). Thus, the ensuing optimization problem solving sequence will solve for these terms, but, clearly, these values will change over the temperature, supply voltage and threshold voltage variations encompassed by the set of scenarios. The "unknown and scenario dependent" variables can be collectively referred to as yi and, the $I_{DS}$ and $V_{DS}$ components of yi are identified as such in FIG. 3. In general there can be other types of unknown, dependent variables, such as device capacitances, transconductances and other device characteristics, etc.

Typically, "known and scenario independent" terms correspond to known details of the targeted semiconductor manufacturing process (or, at least terms that are based on such details) or a designer specified value that remain constant over design scenarios. Examples of known and scenario independent manufacturing process details include constants that determine physical dimensions of the circuit. The "known and scenario independent" terms observed in the equation family of FIG. 2B that pertain to the semiconductor manufacturing process include constants $k_3$ through $k_5$. Also, for this example, the amplifier's load capacitance $C_L$ is a known and scenario independent variable because it is designer specified and capacitance are assumed to not vary from scenario to scenario. Also, because the steady state and small signal input voltages ($V_{IN}$ and $v_{in}$) are designer specified and assumed fixed for the present example, they are also identified as "known and scenario independent" terms. The "known and scenario independent" terms can be collectively referred to as u0 and are identified as such in FIG. 3.

Typically, "known and scenario dependent" terms correspond to known details of the targeted semiconductor manufacturing process (or, at least terms that are based on such details) or a designer specified value that take different values over design scenarios. Examples of known and scenario dependent manufacturing process details include materials employed by the process, dopant levels, etc. The "known and scenario dependent" terms observed in the equation family of FIG. 2B that pertain to the semiconductor manufacturing process include constants $k_1$ and $k_2$. Other known and scenario dependent terms include threshold voltage ($V_T$) and supply voltage ($V_{DD}$) (note that temperature can be introduced into a scenario definition through actual expressions of $V_T$, $k_1$ and $k_2$). The "known and scenario dependent" terms can be collectively referred to as ui and are identified as such in FIG. 3.

FIG. 4 shows an exemplary embodiment of the specification for a scenario as it is presented to a optimization problem solver (such as a signomial problem solver or a geometric programming problem solver or general purpose optimization solver). Here, note that the behavioral characteristics of equations 1 through 3 of FIG. 2B are restated as inequalities. That is, the GAIN is restated to be any value greater than 2.0, UGBW is restated to be any value greater than 100 MHz and POWER is restated to be any value less than 10 mW. SIZE is stated as the objective. As such, in the present example, an attempt is being made to minimize the surface area consumption of the circuit in view of: 1) the designer specified "constraints" for GAIN, UGBW, POWER, CL (designer specified to be 2 pF in view of eqn. 8), $V_{IN}$ (designer specified to be 1.0 V in view of eqn. 7) and $v_{in}$ (designer specified to be 0.0 V in view of eqn. 9); 2) the remaining known scenario independent values u0 $k_3$ through $k_5$ (specified in equations 10 through 14); 3) the known scenario dependent values specified in equations 15 and 16 (and equations that include k1 or k2).

Here, if the specification of FIG. 4 is presented to a optimization problem solver with the x and y terms left unspecified, the optimization problem solver will "solve" the specification for the scenario by calculating numeric values for the x and y terms that correspond to the minimum size of the amplifier where the designer specified behavioral constraints and the u0 and u1 constraints are not violated.

Thus, continuing with the discussion of the design methodology of FIG. 1, once the family of equations (FIG. 2B) and scenarios (FIG. 3) are defined 101, 102 for the circuit under design, the unknown and scenario independent variables x within the circuit are identified 103 and a subset of the scenarios are identified 104. Some degree of intelligent selection of scenarios may be used to identify the subset of scenarios. For example, according to one embodiment that uses the following scenario defining parameters:

A. Corner={Typical-Typical, Slow-Slow, Fast-Fast}
B. Temperature={Nominal, Hot, Cold}
C. $V_{DD}$={Nominal, High, Low}
D. Reference Current={Nominal, High, Low}, the following seven scenarios are identified in Table 1 below as the initial subset of process 104:

TABLE 1

|        | 1  | 2  | 3  | 4  | 5  | 6  | 7  |
|--------|----|----|----|----|----|----|----|
| Corner | TT | SS | SS | SS | SS | FF | FF |
| Temp   | N  | H  | H  | C  | C  | H  | C  |
| Vdd    | N  | L  | H  | L  | H  | H  | H  |
| Iref   | N  | L  | H  | H  | H  | L  | H  |

Note that the above table refers to a more generic set of known scenario dependent parameters than the example being discussed herein in that, the above table refers to a circuit's reference current Iref value and the exemplary amplifier being discussed herein does not include a reference current (Iref) parameter. As such, note that embodiments to which the above table refers defines seven, specific scenarios from a larger field of scenarios at process 104 of FIG. 1.

By contrast, the more simplistic amplifier example being discussed herein only includes three known, scenario dependent parameters (corner, temp and Vdd). Each of the seven scenarios identified in the above table are observed in FIG. 3 however. As alluded to in more detail below, for the simple amplifier example of FIG. 3, a subset of the scenarios identified in the table above may be used in process 104 of FIG. 1 rather than all seven (e.g., three scenarios from the above table may be selected from FIG. 3 at process 104 of FIG. 1). A common choice of scenarios for this simpler case would be scenario 1, 2 and 7 in the above table. Note that in general Iref is the reference bias which is used in many analog circuits to determine the bias point of the circuit. Note also that additional/different scenario dependent process parameters are possible (such as multiple reference currents, load values, etc.) in which case the table above would be expanded or modified.

After the subset of scenarios is identified, an optimization problem solving sequence is undertaken 105 that concurrently solves the family of equations over the limited subset of scenarios. Here, for instance, the solving process that transpires over the limited subset of scenarios 105 may be undertaken by submitting a specification, such as that observed in FIG. 4, to optimization problem solver for each of the scenarios (where equations 15 and 16 are refitted with new values for each scenario within the limited subset).

The solution provided by the optimization problem solver produces specific values for the x terms (which can be referred to in regards to the present example as W_1, n_1, L_1 and RL_1) and y terms. That is, at this point, the x terms can be tentatively labeled as "known" rather than "unknown". For instance, if scenarios 1, 2 and 7 are identified in process 104 as the subset of scenarios, the result of the optimization problem solving sequence of process 105 may produce the following "optimal" results: W_1=15 µm; n_1=2; L_1=1.8 µm; RL_1=1.70 kΩ.

The family of equations within the scenario specifications are then adjusted to include these specific numeric values for the x terms and another optimization problem solving sequence 106 is undertaken over the remaining scenarios that were not identified in process 104 in order to check the feasibility of the solution for x provided by process 105. The main goal in process 106 is to determine whether there is a value of y_i for each of the remaining scenarios that produces an optimal solution given the fixed set of values x found in process 105 (i.e., process 106 checks to see if "feasible" solutions exist for the remaining scenarios using the values for x determined in process 105). In this example, the remaining scenarios correspond to scenarios 3 through 6 and 8.

The optimization problem of process 106 is different from the optimization problem of process 105 in the fact that process 105 solves all scenarios concurrently while process 106 solves each scenario individually (e.g., one after another). At the conclusion of the second optimization problem solving sequence 106, either 107 all scenarios have been solved for optimally (in which case the design of the circuit is complete 109 because an optimal solution has been reached for all scenarios over a consistent set of scenario independent terms x and u0), or, an optimal solution could not be obtained for one or more of the remaining scenarios. Such scenarios are referred to as "infeasible" scenarios. For instance, assume that scenario 3 could not be optimally solved with the W_1, n_1, L_1 and RL_1 values specified above.

If infeasible scenarios exist, the infeasible scenarios are effectively added to the original set of scenarios identified in process 104 to create an expanded subset of scenarios. Continuing with this example, to form the expanded subset of scenarios, scenario 3 would be added to scenarios 1, 2 and 9. The expanded subset of scenarios (in this case scenarios 1, 2, 3 and 9) are then solved 105 with the x terms having been reverted back to unknown variables that the optimization problem solving sequence 105 solves for. Thus, a second set of specific numeric values are produced for the x terms (W_2, n_2, L_2 and RL_2) at the completion of the second execution of process 105. Assume these are W_2=17.4 µm; n_2=2; L_2=2.1 µm; RL_2=1.77 kΩ.

Again, the family of equations within the scenario specification are adjusted to incorporate the numeric values for the W_2, n_2, L_2 and RL_2 terms and the family of equations are re-solved with an optimization problem solving sequence 106 over the remaining set of scenarios (in this case scenarios 4 through 8). Here, the remaining set of scenarios used for the second execution of process 106 (scenarios 4 through 8) is smaller than the set of scenarios used for the first execution of process 106 (scenarios 3 through 9) owing to the removal of the initially infeasible scenario(s) (scenario 3). The feasibility of the remaining scenarios is checked 107 and the process repeats.

As such, the design methodology revolves around generating (with process 105) specific numeric values for x terms by solving a family of equations over a subset of the total collection of applicable scenarios. The remaining scenarios are then solved (with process 106) with the newly calculated numeric values for the x terms incorporated into the family of equations to see if they "hold" (i.e., optimal solutions for the remaining scenarios are obtained).

If the numeric values for the x terms do not hold, the infeasible scenarios are added to the subset of scenarios used by process 105 to generate a new set of numeric values for the x terms and the process repeats. Here, by repeatedly expanding the subset of scenarios used to calculate numeric values for the x terms with scenarios for which an infeasibility was flagged, a form of feedback is introduced into the design methodology that either "zeroes in" on a set of numeric values for the x terms that work for all scenarios, or, results in the design being deemed infeasible when considered across the collection of scenarios.

It is pertinent to point out that the incorporation of equalities into a robust, active set optimization problem are believed to be novel, non obvious innovations by themselves.

A few implementation specifics are worth mentioning. Firstly, the manner in which the initial subset of scenarios is identified 104 may vary from embodiment to embodiment. According to a first approach, a designer (e.g., through a graphical user interface (GUI)) or automated software program simply guesses at one or more suitable scenarios. According to a second approach, a designer or automated software program identifies a scenario representative of nominal values (e.g., scenario 1 in FIG. 3) or worst case values or combination of the two.

Additionally, referring to FIG. 1, processes 101 and/or 102 may involve some manual efforts (such as derivation of the equations specified in process 101 by hand and/or manual submission of specific scenarios or components thereof). However, each of processes 103 through 108 is capable of being fully performed in software through execution of program code on a computing system. Moreover, in assisting the automated software implementation of the teachings herein, the family of equations specified in process 101, the set of operational scenarios of process 102 (including a scenario specification such as the scenario specification of FIG. 4) can each be tangibly embodied (e.g., in a file and/or text document) stored on a machine readable storage medium as described further below. Likewise, once the design methodology produces a consistent set of transistor level details for a circuit under design, the transistor level details can be incorporated into a transistor level description (such as a transistor level netlist) or mask set description (e.g., in GDS-II format) and stored on a machine readable storage medium.

Processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.)), and/or, electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

It is believed that processes taught by the discussion above may also be described in source level program code in various object-orientated or non-object-orientated computer programming languages (e.g., Java, C#, VB, Python, C, C++, J#, APL, Cobol, Fortran, Pascal, Perl, etc.) supported by various software development frameworks. The source level program code may be converted into an intermediate form of program code (such as Java byte code, Microsoft Intermediate Language, etc.) that is understandable to an abstract execution environment (e.g., a Java Virtual Machine, a Common Language Runtime, a high-level language virtual machine, an interpreter, etc.) or may be compiled directly into object code.

According to various approaches the abstract execution environment may convert the intermediate form program code into processor specific code by, 1) compiling the intermediate form program code (e.g., at run-time (e.g., a JIT compiler)), 2) interpreting the intermediate form program code, or 3) a combination of compiling the intermediate form program code at run-time and interpreting the intermediate form program code. Abstract execution environments may run on various operating systems (such as UNIX, LINUX, Microsoft operating systems including the Windows family, Apple Computers operating systems including MacOS X, Sun/Solaris, OS/2, Novell, etc.).

An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable storage media suitable for storing program code.

Figure 5:
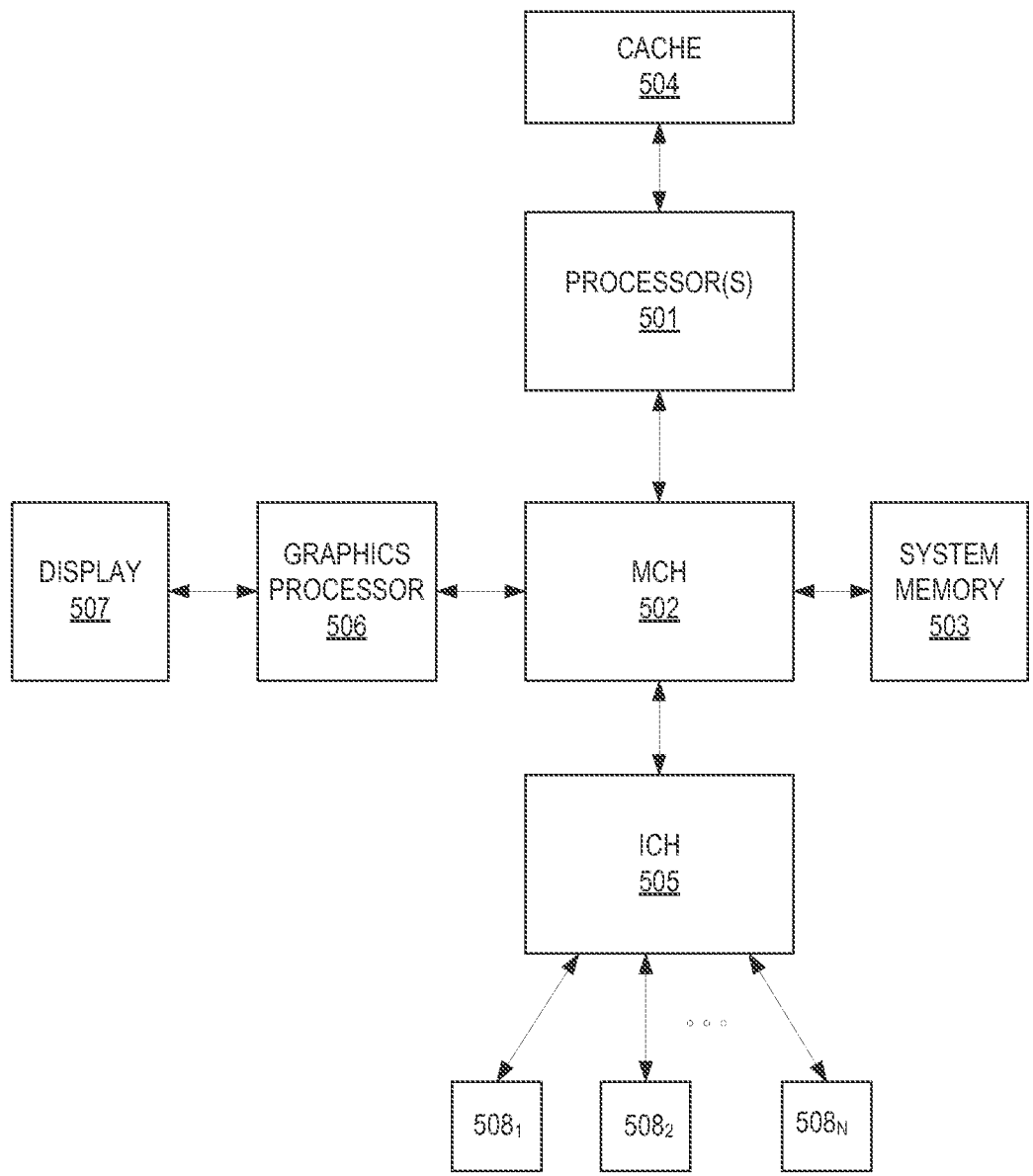
FIG. 5 shows an embodiment of a computing system.

FIG. 5 shows an embodiment of a computing system (e.g., a computer). The exemplary computing system of FIG. 5 includes: 1) one or more processors 501; 2) a memory control hub (MCH) 502; 3) a system memory 503 (of which different types exist such as DDR RAM, EDO RAM, etc.); 4) a cache 504; 5) an I/O control hub (ICH) 505; 6) a graphics processor 506; 7) a display/screen 507 (of which different types exist such as Cathode Ray Tube (CRT), Thin Film Transistor (TFT), Liquid Crystal Display (LCD), DPL, etc.; 8) one or more I/O devices 508.

The one or more processors 501 execute instructions in order to perform whatever software routines the computing system implements. The instructions frequently involve some sort of operation performed upon data. Both data and instructions are stored in system memory 503 and cache 504. Cache 504 is typically designed to have shorter latency times than system memory 503. For example, cache 504 might be integrated onto the same silicon chip(s) as the processor(s) and/or constructed with faster SRAM cells whilst system memory 503 might be constructed with slower DRAM cells.

By tending to store more frequently used instructions and data in the cache 504 as opposed to the system memory 503, the overall performance efficiency of the computing system improves.

System memory 503 is deliberately made available to other components within the computing system. For example, the data received from various interfaces to the computing system (e.g., keyboard and mouse, printer port, LAN port, modem port, etc.) or retrieved from an internal storage element of the computing system (e.g., hard disk drive) are often temporarily queued into system memory 503 prior to their being operated upon by the one or more processor(s) 501 in the implementation of a software program. Similarly, data that a software program determines should be sent from the computing system to an outside entity through one of the computing system interfaces, or stored into an internal storage element, is often temporarily queued in system memory 503 prior to its being transmitted or stored.

The ICH 505 is responsible for ensuring that such data is properly passed between the system memory 503 and its appropriate corresponding computing system interface (and internal storage device if the computing system is so designed). The MCH 502 is responsible for managing the various contending requests for system memory 503 access amongst the processor(s) 501, interfaces and internal storage elements that may proximately arise in time with respect to one another.

One or more I/O devices 508 are also implemented in a typical computing system. I/O devices generally are responsible for transferring data to and/or from the computing system (e.g., a networking adapter); or, for large scale non-volatile storage within the computing system (e.g., hard disk drive). ICH 505 has bi-directional point-to-point links between itself and the observed I/O devices 508.

It is believed that processes taught by the discussion above can be practiced within various software environments such as, for example, object-oriented and non-object-oriented programming environments, Java based environments (such as a Java 2 Enterprise Edition (J2EE) environment or environments defined by other releases of the Java standard), or other environments (e.g., a .NET environment, a Windows/NT environment each provided by Microsoft Corporation).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method, comprising:
    solving, using a computing device, a family of equations for a circuit being designed over a first subset of operational scenarios concurrently, producing numeric values for design parameters of the circuit;
    solving the family of equations enhanced with the numeric values over a second subset of the operational scenarios individually, wherein the second subset of the operational scenarios comprises remaining operational scenarios after the first subset of the operational scenarios is processed; and
    producing a design for the circuit that includes the numeric values for the design parameters.

2. The method of claim 1, wherein the producing of the design includes producing a transistor level netlist for the circuit.

3. The method of claim 1 wherein the operational scenarios include different combinations of at least one of: manufacturing process corner, temperature, and supply voltage.

4. The method of claim 1 wherein the design parameters include dimensions of circuit elements within the circuit.

5. The method of claim 1 wherein the design parameters include at least one of:
    an electrical current within the circuit;
    a voltage within the circuit.

6. The method of claim 1, wherein each of the family of equations is signomial and the solving is performed by a signomial programming problem solver.

7. The method of claim 1, wherein each of the family of equations is posynomial and the solving is performed by a geometric programming problem solver.

8. The method of claim 1, wherein the numeric values are a first numeric values, the method further comprising:
    identifying one or more of the second subset of the operational scenarios as infeasible scenarios;
    adding the infeasible scenarios to the second subset and resolving the family of equations to produce a second numeric values for the design parameters; and,
    solving the family of equations with the second numeric values over a third subset of the operational scenarios and producing a design for the circuit that includes the second numeric values.

9. A non-transitory machine readable storage medium having program code stored thereon that when processed by a processing unit causes a method to be performed, the method comprising:
    solving a family of equations for a circuit being designed over a first subset of operational scenarios concurrently, producing numeric values for design parameters of the circuit;
    solving the family of equations enhanced with the numeric values over a second subset of the operational scenarios individually, wherein the second subset of the operational scenarios comprises operational scenarios that are not in the first subset of the operational scenarios; and
    producing a design for the circuit that includes the numeric values.

10. The non-transitory machine readable storage medium of claim 9 wherein the design parameters include unknown and scenario independent dimensions of transistors within the circuit.

11. The non-transitory machine readable storage medium of claim 9, wherein the producing of the design includes producing a transistor level netlist for the circuit.

12. The non-transitory machine readable storage medium of claim 9, wherein each of the family of equations is posynomial and the solving is performed by a geometric programming problem solver.

13. A computing system having a non-transitory machine readable storage medium with program code stored thereon that when executed by the computing system's processing resources performs operations comprising:
    solving a family of equations for a circuit being designed over a first subset of operational scenarios concurrently, producing numeric values for design parameters of the circuit;
    solving the family of equations enhanced with the numeric values over a second subset of the operational scenarios sequentially, wherein the second subset of the operational scenarios comprises remaining operational scenarios after the first subset of the operational scenarios is processed; and
    producing a design for the circuit that includes the numeric values.

14. The computing system of claim 13, wherein the operational scenarios include different combinations of temperature and supply voltage.

15. The computing system of claim 13, wherein the first subset of the operational scenarios includes different scenarios having different combinations of values for corner, temperature, VDD and reference current, wherein the values are respectively chosen from the following options:

A. Corner={Typical-Typical, Slow-Slow, Fast-Fast}
B. Temperature={Nominal, Hot, Cold}
C. $V_{DD}$={Nominal, High, Low}
D. Reference Current={Nominal, High, Low}.

16. The computing system of claim 13, wherein the numeric values are a first numeric values, the operations further comprising:

identifying one or more of the second subset of the operational scenarios as infeasible scenarios;

adding the infeasible scenarios to the second subset and resolving the family of equations to produce a second numeric values for the design parameters; and, solving the family of equations with the second numeric values over a third subset of the operational scenarios and producing the design for the circuit that includes the second numeric values.

17. The computing system of claim 13, wherein the operations for producing the design includes operations for producing a transistor level netlist for the circuit.

18. The computing system of claim 13, wherein the design parameters include dimensions of circuit elements within the circuit.

19. The computing system of claim 13, wherein the design parameters include at least one of:

an electrical current within the circuit;
a voltage within the circuit.

20. The computing system of claim 13, wherein each of the family of equations is signomial and the solving is performed by a signomial programming problem solver.

* * * * *